| United States Patent [19] | [11] Patent Number: 5,615,128 |
| --- | --- |
| Scepanovic et al. | [45] Date of Patent: *Mar. 25, 1997 |

[54] TOWARDS OPTIMAL STEINER TREE ROUTING IN THE PRESENCE OF RECTILINEAR OBSTACLES

[75] Inventors: Ranko Scepanovic, Cupertino; Cheng-Liang Ding, San Jose, both of Calif.

[73] Assignee: LSI Logic Corporation, Milpitas, Calif.

[ * ] Notice: The portion of the term of this patent subsequent to Feb. 13, 2013, has been disclaimed.

[21] Appl. No.: 599,764

[22] Filed: Feb. 12, 1996

Related U.S. Application Data

[63] Continuation of Ser. No. 131,770, Oct. 4, 1993, Pat. No. 5,491,641.
[51] Int. Cl.$^6$ ................................................. G06F 17/50
[52] U.S. Cl. ........................... 364/489; 364/488; 364/490
[58] Field of Search .................................. 364/488, 489, 364/490, 491, 578

[56] References Cited

U.S. PATENT DOCUMENTS

| | | | |
| --- | --- | --- | --- |
| 4,855,929 | 8/1989 | Nakajima | 364/490 |
| 4,858,143 | 8/1989 | Fournier | 364/491 |
| 4,918,614 | 4/1990 | Modarres et al. | 364/490 |
| 5,295,082 | 3/1994 | Chang et al. | 364/490 |
| 5,309,370 | 5/1994 | Wong | 364/490 |
| 5,491,641 | 2/1996 | Scepanovic et al. | 364/491 |

OTHER PUBLICATIONS

Ho et al., "New Algorithms for the Rectilinear Steiner Tree Problem," IEEE Trans. on CAD. vol. 9, No. 2, Feb. 1990, pp. 185–193.
Hill et al., "Global Routing Considerations in a Cell Synthesis System," 1990 27th ACM/IEEE Design Automation Conf, pp, 312–316.
Kahng, "A Steiner Tree Construction for VLSI Routing," Neural Networks, 1991 IEEE Int'l Conf, pp. 133–139.
Lewis et al., "Optimum Steiner Tree Generation," 2nd Great Lakes VLSI Symposium, 1992, pp. 207–212.
Makki et al., "The Steiner Tree Problem with Minimum Number of Vertices in Graphs," 2nd Great Lakes VLSI Symposium, 1992, pp. 204–206.
Matsumoto et al., "Two New Efficient Approximation Algorithms with O(klogk) for the Steiner Tree Problem in Rectilinear Graphs," 1991 IEEE, pp. 1156–1159.
Sakai et al., "An Efficient Approximation Algorithm for the Steiner Tree Problem in Rectilinear Graphs," 1989 IEEE int'l Symposium, pp. 339–3342.

(List continued on next page.)

*Primary Examiner*—Kevin J. Teska
*Assistant Examiner*—Leigh Marie Garbowski
*Attorney, Agent, or Firm*—Poms, Smith, Lande & Rose

[57] ABSTRACT

An apparatus and method for locating a good approximation of optimal Steiner tree routing in the presence of rectilinear obstacles, including finding a Steiner tree on an escape graph. The escape graph is constructed by forming lines from given points (pins) and obstacles. Obstacles and the segments of obstacles are provided with lines parallel to that segment at a given minimum distance $s_{min}$ from the. The lines are constructed until they reaches either a boundary of an obstacle or a boundary of the core. For pins which do belong to a boundary of an obstacle, a ray, perpendicular to the segment of the boundary on which the pin is located is constructed from the pin and out from the obstacle until it reaches another obstacle or a boundary of the core. For pins which do not belong to an obstacle, vertical and horizontal lines are constructed. A Steiner tree may then be found on the escape graph by using any number of algorithms such as algorithm S and algorithm M. The solution to the problem of finding a Steiner tree for the escape graph also provides a suitable approximation of a Steiner tree for the original problem. This apparatus or method may be used to optimize the routing of conductive paths on integrated circuits.

20 Claims, 7 Drawing Sheets

OTHER PUBLICATIONS

Mehlhorn, "A Faster Approximation Algorithm for the Steiner Problem in Graphs," Information Processing Letter 27, Elsevier Science Publishers B.V., Mar. 1988, pp. 125–128.

Matsumoto et al., "A New Efficient Algorithm for the Steiner Tree," 1990 IEEE Int'l Symposium on Circuits and Systems, pp. 2873–2874.

Hanan, "On Steiner's Problem with Rectilinear Distance," Journal SIAM Applied Math. vol. 14, No. 2, Mar. 1966, pp. 255–265.

Wu et al., "Rectilinear Shortest Paths and Minimum Spanning Trees in the Presence of Rectilinear Obstacles," IEEE Trans on Computers, vol. C–36, No. 3, Mar. 1987, pp. 321–331.

Chiang et al., "An Optimal Algorithm for Rectilinear Steiner Trees for Channels with Obstacles," Int'l Journal of Circuit Theory and Applications, vol. 19, pp. 551–563, 1991.

TOWARDS OPTIMAL STEINER TREE ROUTING IN THE PRESENCE OF RECTILINEAR OBSTACLES

This application is a continuation of U.S. patent application Ser. No. 08/131,770, filed Oct. 4, 1993, now U.S. Pat. No. 5,491,641.

FIELD OF THE INVENTION

This invention relates to devices and methodologies for finding rectilinear Steiner trees in the presence of obstacles.

BACKGROUND OF THE INVENTION

Modern integrated circuits such as VLSI devices are typically made up of a large number of functional components formed on a single circuit substrate, or die. An increasingly important aspect of integrated circuit design concerns the placement of these functional components and the organization of interconnective paths that provide for the transmission of electrical signals between these functional components. Various algorithms have been developed to optimize the layout and interconnection of the functional components in an integrated circuit. The design of suitable interconnective pathways on an integrated circuit is typically termed routing. One goal of routing is to connect the functional components of the chip using the shortest possible conductive paths available.

A class of paths termed Steiner trees has been developed as one method that is used in the physical design of integrated circuits to efficiently route multi-terminal interconnective nets. A Steiner tree for n demand points is a tree (a connected graph with no closed paths) made up of lines that interconnect all n demand points of the tree. A Steiner tree, unlike for example a spanning tree, may also contain additional vertices that are not among the n demand points, in order to achieve a shorter pathway among these n demand points. A rectilinear Steiner tree (RST) of n demand points may be characterized as a tree composed only of orthogonal line segments (typically termed edges) that interconnect all n demand points (which are located at vertices). A rectilinear Steiner tree (RST) is confined to an underlying grid type graph which has traditionally been defined as the intersections of orthogonal lines (usually horizontally and vertically oriented) that are drawn through the n demand points. A graph may be considered a pair of sets G=(V, E), where V is a set of vertices or points, and E is a set of edges between the vertices. Finding a minimum rectilinear Steiner tree (MRST) can be characterized as finding a Steiner tree whose edges are constrained to rectilinear shapes that in combination connect all of the desired points in the shortest path available.

Preferably, the interconnective paths of the various functional devices in an integrated circuit do not cross through the functional devices themselves. These functional components therefore represent obstacles on a chip that must be considered in routing. It is therefore advantageous to consider the general problem of finding an MRST in the presence of such obstacles. A rectilinear obstacle (referred to as "obstacle" in the remainder of this application) can be considered a region in a plane bounded by a polygon whose sides are parallel to some coordinate system. For example, all of the sides of the obstacle may be vertically or horizontally oriented (see FIG. 1). The problem of finding an MRST is a specific case of the more general problem of finding an MRST in the presence of rectilinear obstacles (MRSTO) with the number of obstacles equal to zero (0). Although there is extensive literature on the MRST problem, there previously was no solution for the general MRSTO problem.

BRIEF SUMMARY OF THE INVENTION

A principal object of the present invention is to provide a device and method for obtaining a good approximation of a minimum rectilinear Steiner tree in the presence of rectilinear obstacles. In accordance with the present invention, apparatus and methods for finding an optimal Steiner tree routing path in the presence of rectilinear obstacles includes finding a Steiner tree on a uniquely defined graph. This graph, termed herein an escape graph, is constructed by forming lines from the set of preselected demand points to be interconnected (hereinafter termed pins) and the obstacles present on the integrated circuit die. For each obstacle and for each segment of a boundary to an obstacle, a line is competed parallel to that segment at some distance $s_{min}$ (a predetermined non-negative real number termed herein the minimum spacing) from the obstacle. Currently, actual physically implemented VLSI circuits usually require some minimum allowable distance between the boundary of a functional component representing an obstacle and the nearest conductive track following the pathway determined by the routing process. Where such a minimum allowable distance is not required, the value of $s_{min}$ may be zero.

The line being dram parallel to the segment of the obstacle extends until it reaches either a boundary of an obstacle or a boundary of the region in which all the pins and obstacles reside, termed the core. For each pin that does not reside at the boundary of an obstacle, lines are drawn parallel to an appropriately oriented coordinate system, extending from the pin until they reach another obstacle or the edge of the core. For each pin located at a boundary of some obstacle, a my (a line extending in only one direction) is drawn perpendicular to the boundary at which the pin resides, extending away from the obstacle until another obstacle or a boundary of the core is reached. Any algorithm suitable for determining a Steiner tree may then be applied to this escape graph to find an approximation of the minimum Steiner tree for the original problem, which included the obstacles.

Although the methods discussed herein focus on an optimizing process according to length and distance, any weights assigned to the edges of the graph may also be used for the purpose of eliminating or reducing congestion on the integrated circuit chip during the routing of a set of nets. Since the existence of at least some obstacles is almost always unavoidable in real integrated circuit designs, one advantage of the present invention is that it rapidly provides a good approximation of a MRSTO.

Other objects, features and advantages of the present invention will become apparent from a consideration of the following detailed description, and from the accompanying drawings.

DETAILED DESCRIPTION OF THE PREFERRED EMBODIMENTS

Figure 4:
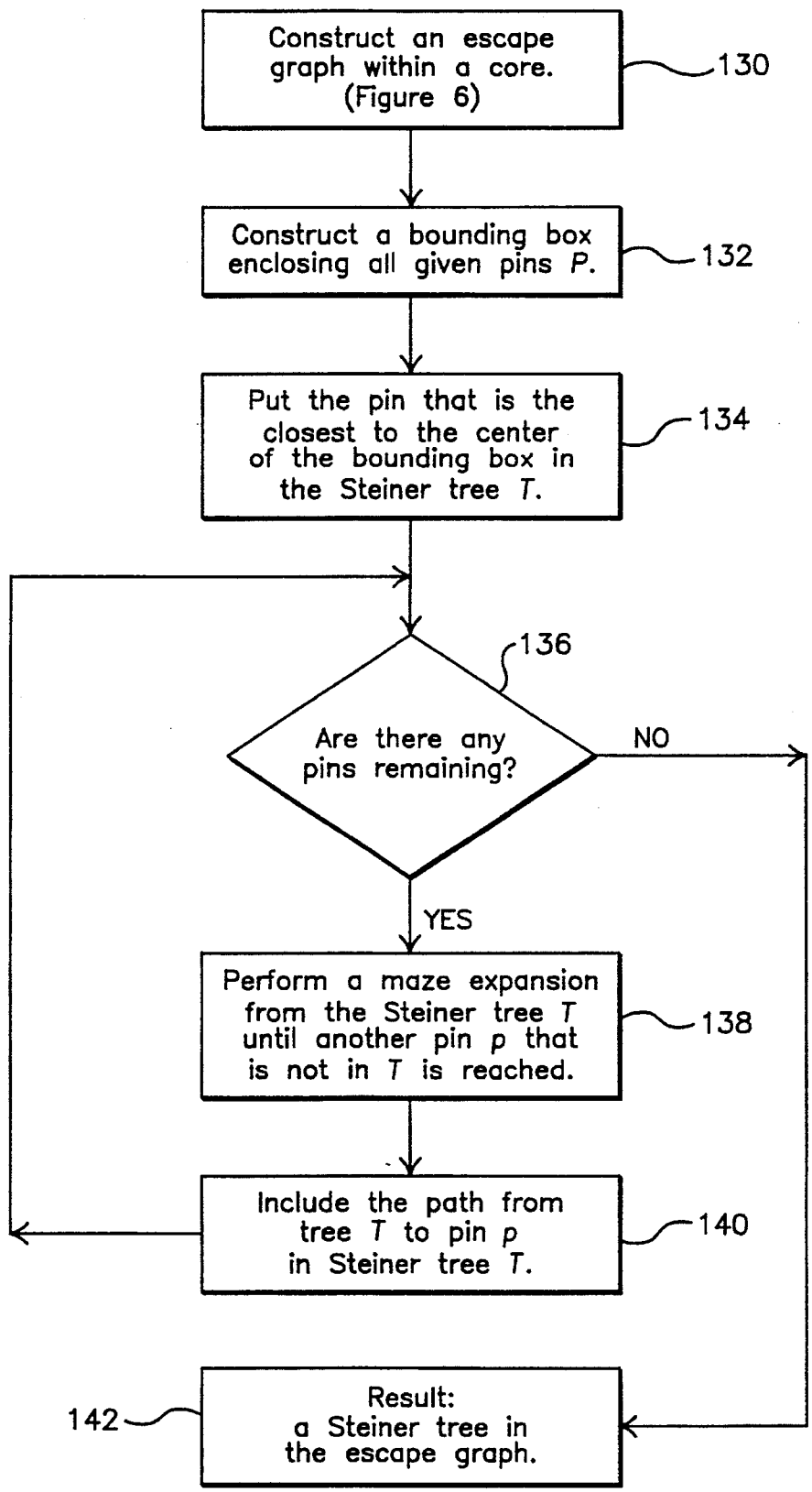
FIG. 4 is a flowchart of algorithm M.
Figure 6:
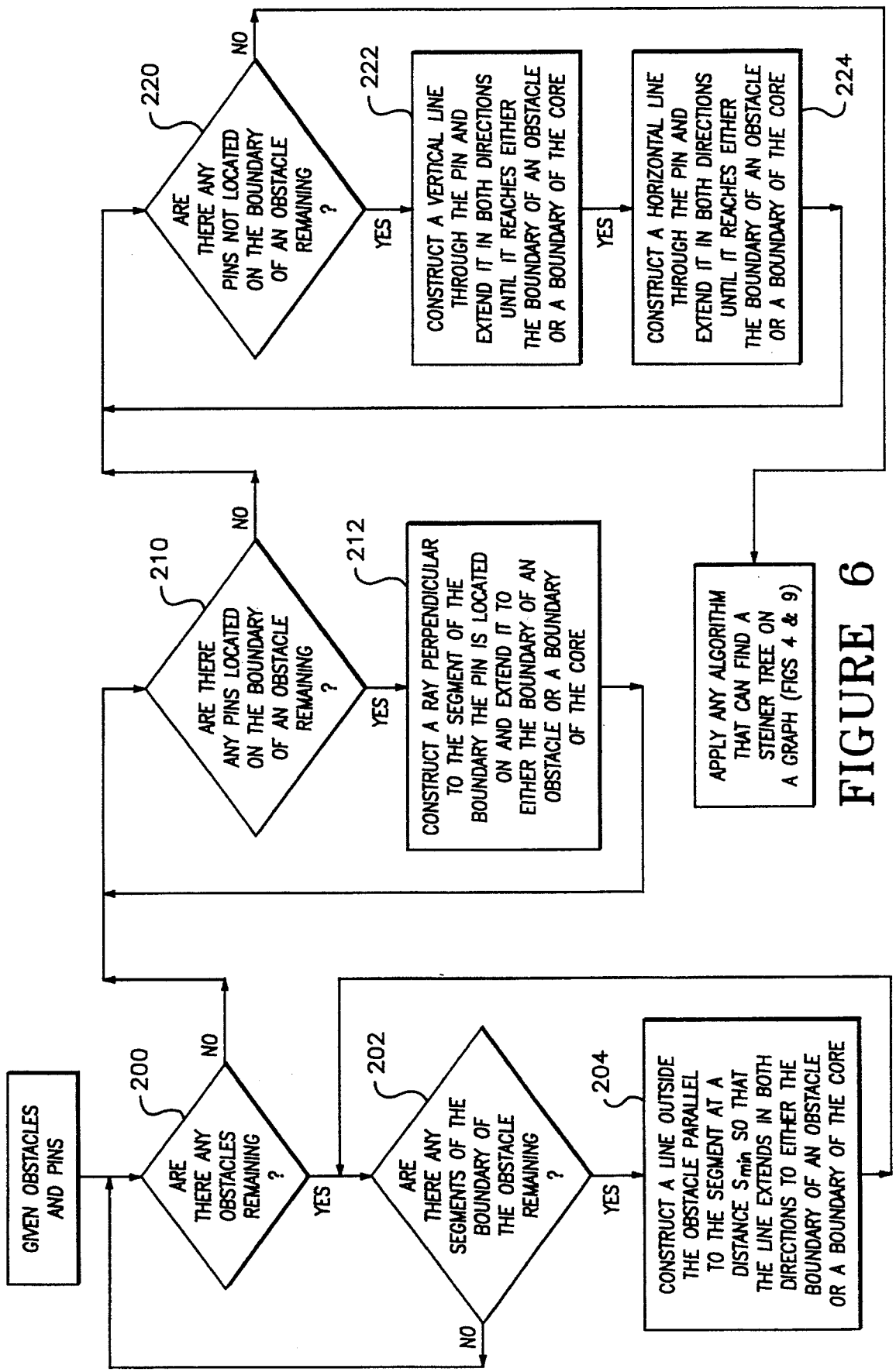
FIG. 6 is a flowchart of a method for creating an escape graph (G) within a core using a single microprocessor.
Figure 7:
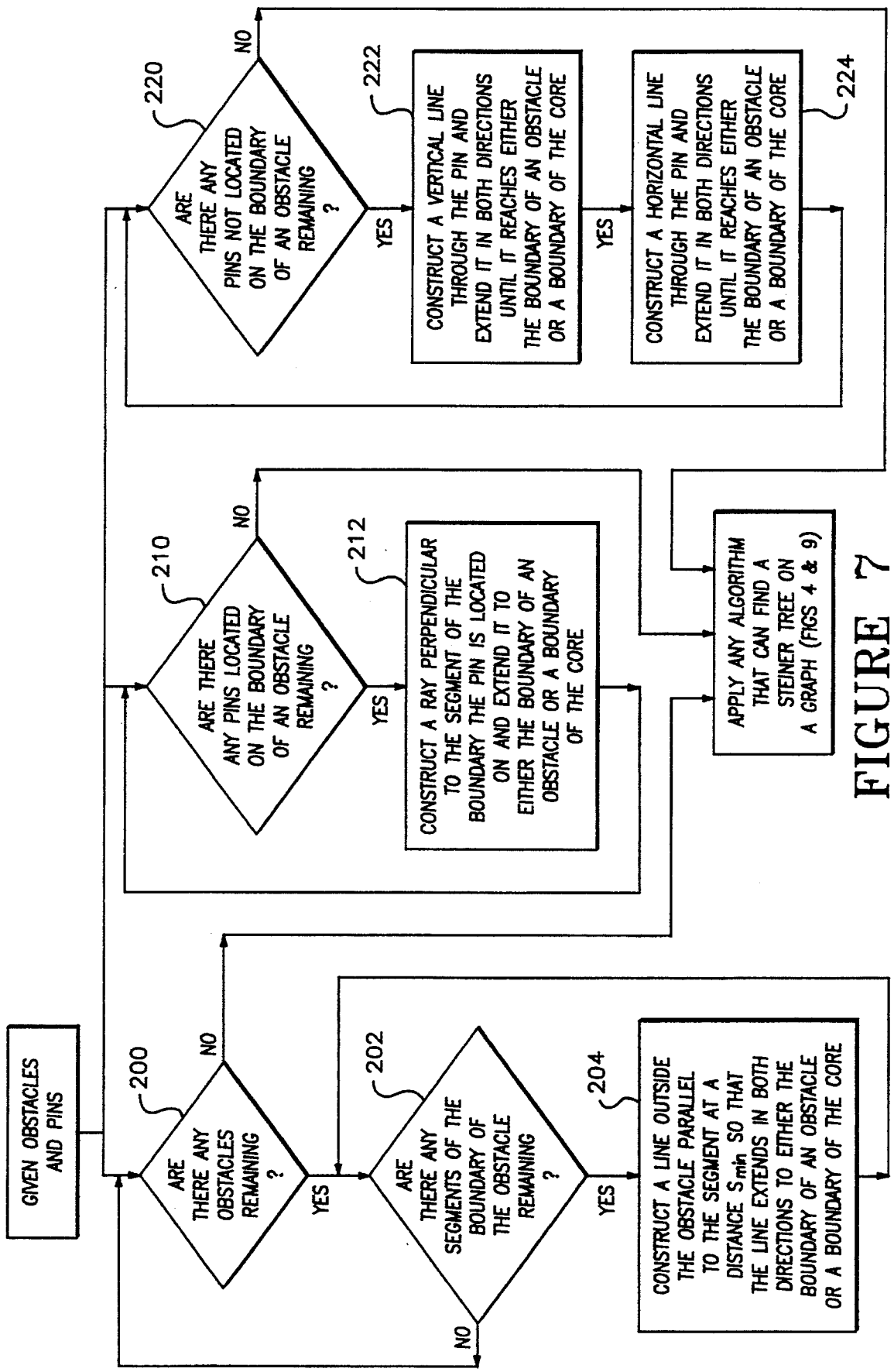
FIG. 7 is a flowchart of a method for creating an escape graph (G) within a core using by multiple microprocessors.

An apparatus and method of the present invention for finding a good approximation of an optimal Steiner tree routing in the presence of rectilinear obstacles includes finding a Steiner tree in a uniquely constructed graphs termed an escape graph. FIGS. 6 and 7 show the details of constructing an escape graph (physically shown in FIG. 2) by forming escape lines (or conductive paths) from given points (pins) and obstacles. Any algorithm suitable for determining Steiner trees on a graph is then applied to the escape graph to find an approximation of a minimal Steiner tree for the original problem. Examples of two such algorithms are detailed in FIGS. 4 and 8 and described more fully below.

Figure 1:
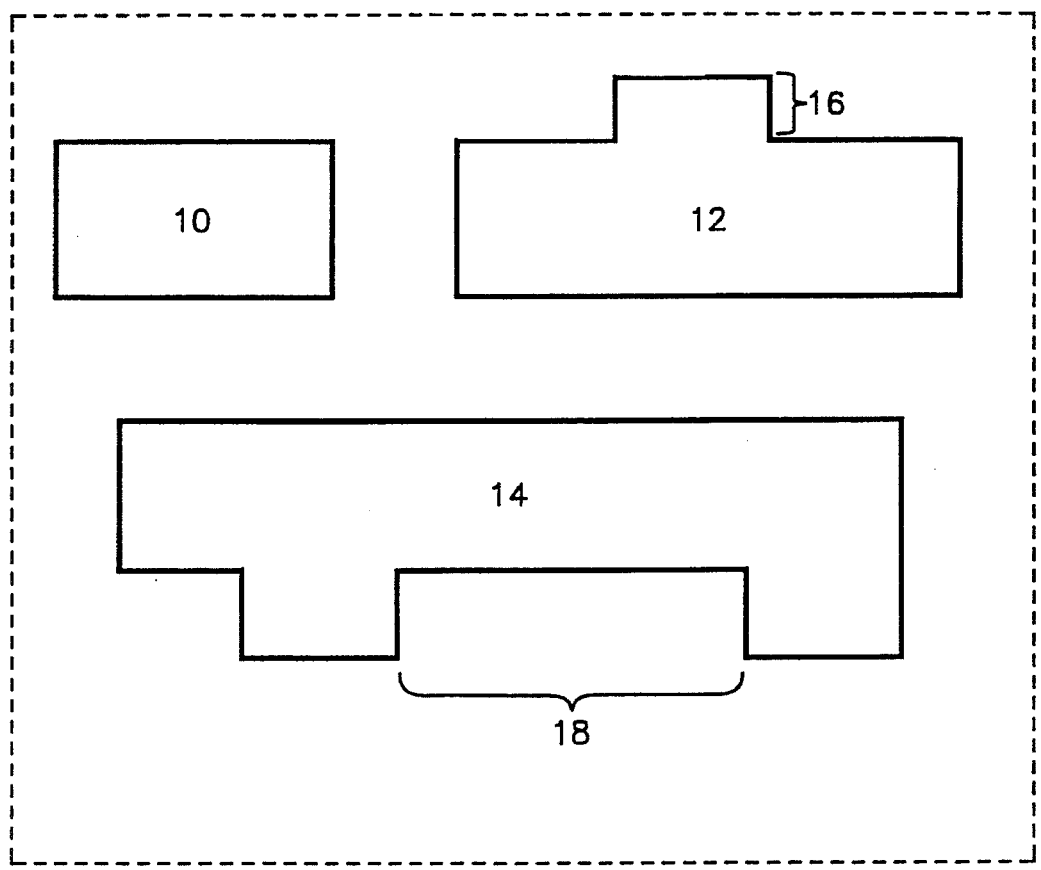
FIG. 1 is a top view of a rectilinear obstacle.

Referring to, FIG. 1 there is shown a depiction of a core 19 with three rectilinear obstacles 10, 12, and 14. These rectilinear obstacles are regions in the plane bounded by a polygon whose sides are parallel to some Cartesian coordinate system. These obstacles may be rectangular 10 or have one or more protrusions as illustrated at fingers 16 or one or more inlets as illustrated at 18.

Figures 2, 3B:
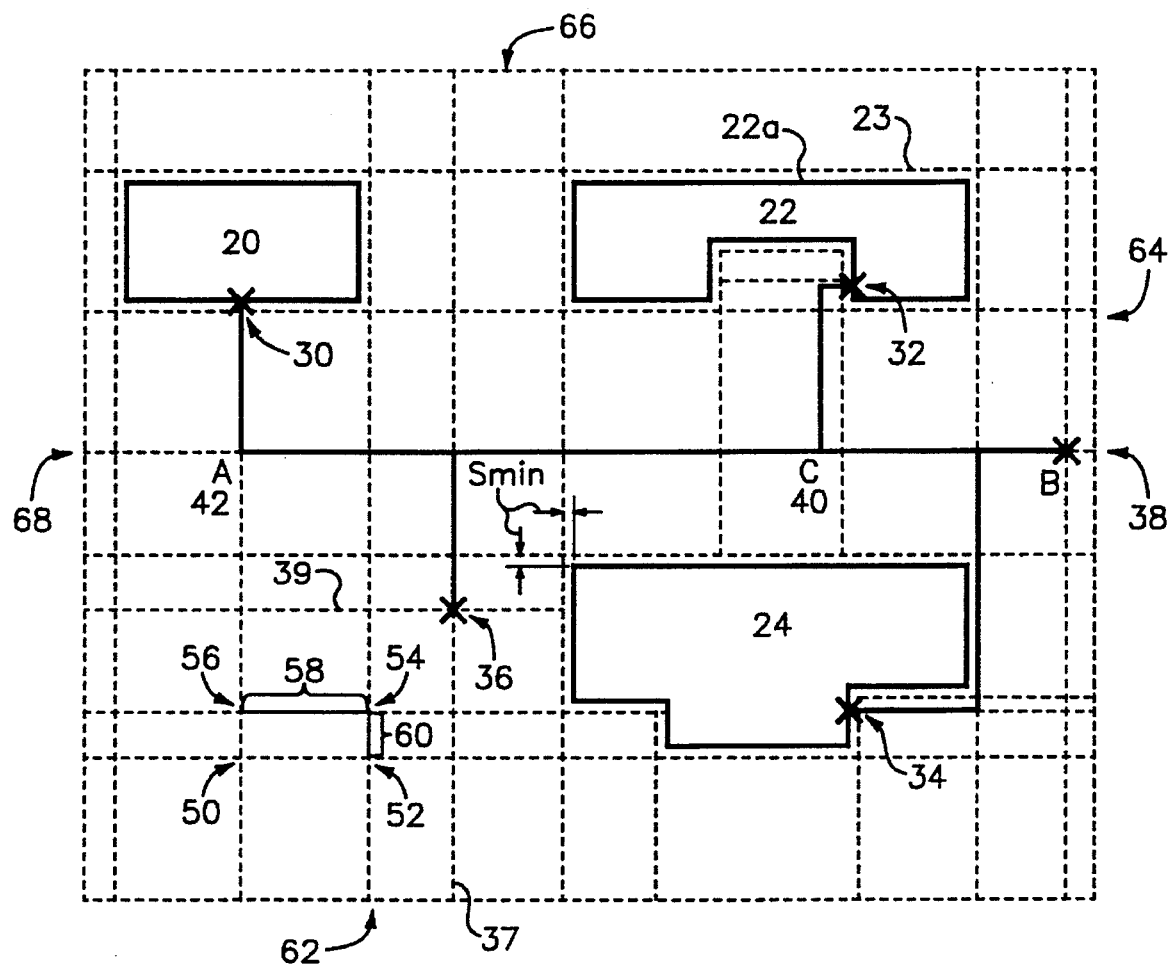
FIG. 2 is a top view of a core with rectilinear obstacles and pins from which an escape graph and a rectilinear Steiner the has been constructed.
FIG. 3B is a net routed by a maze expansion algorithm.

To construct an escape graph, such as the graph shown in FIG. 2, a Cartesian coordinate system may be established in a plane so that all coordinates may be given with respect to this coordinate system. The distance d ($P_1$, $P_2$) between any two points $P_1$ and $P_2$ in this escape graph may be considered the rectilinear or Manhattan distance between the points.

As shown in FIG. 2, the core is defined by boundaries 62, 64, 66, and 68. Within these boundaries are predetermined rectilinear obstacles, such as obstacles 20, 22, and 24 having vertical and horizontal sides. A predetermined set of pins 30, 32, 34, 36, and 38 are also shown in FIG. 2.

From the predetermined set P of pins (such as pins 30, 32, 34, 36 and 38) and the predetermined set O of obstacles (such as obstacles 20, 22 and 24), a grid system of escape lines may be constructed to form the escape grape These escape lines may be termed either p-escape lines, induced by the pins, or termed o-escape lines, induced by the obstacles.

One or more processing means may be used to determine whether there are obstacles 200, pins on the boundary of an obstacle 210, or pins that are not on the boundary of an obstacle 212. Orthogonal escape lines are constructed accordingly (as discussed more fully below). FIGS. 6 and 7 illustrate flowcharts for the operations to be performed by the one or more processors. FIGS. 6 and 7 are meant to be exemplary, and are not meant to limit the number of processors which may be used, the order in which the determination of the existence of remaining obstacles or pins is accomplished, or the order in which the escape lines or conductive paths are formed.

More specifically, the escape graph is constructed as follows. For each obstacle and each segment of the boundary of an obstacle, a line parallel to that segment is constructed at a distance $s_{min}$ (a given non-negative real number) from the obstacle. This line extends until it reaches either a boundary of an obstacle or a boundary of the core. The value of $s_{min}$ reflects the minimum allowable spacing, for example, between a functional components in an integrated circuit and an adjacent conductive pathway. In appropriate instances the value of $s_{min}$ may be zero. This set of lines parallel to the boundaries of the obstacles defines the set of o-escape lines. A set of exemplary escape lines is shown in FIG. 2. At the obstacle 22, for example, a segment of the polygon representing the obstacle 22 is selected, such as the top segment 22a, and an escape line 23 is constructed parallel to the horizontal top segment 22a. This escape line 23 extends in both directions to the boundaries 64 and 68 of the core since there is no obstacle to block the escape line. Each segment of the obstacle is considered and escape lines are drawn parallel to the segments of the obstacle. As noted above these o-escape lines spaced some non-zero distance $s_{min}$ from the segment of the obstacle.

Along with the obstacles, the predetermined pins p residing on the boundaries of obstacles are also considered. Through each such pin, a ray is constructed perpendicular to the segment of the boundary on which the pin resides, extending from the pin and out from the obstacle until it reaches another obstacle or a boundary of the core. This arrangement of escape lines is also shown in FIG. 2. Pin 32, for example, is located on a vertical segment of obstacle 22. An escape line is constructed perpendicular to that segment until it reaches another segment of obstacle 22. Another example is pin 34 located on a vertical segment of obstacle 24. As shown, an escape line is similarly constructed perpendicular to that segment until it reaches the boundary 64 of the core.

As noted above, the pins p that do not reside on any obstacle are also considered. Through each such pin a pair of mutually orthogonal lines are drawn, each line extending to either an obstacle or a boundary of the core. Referring again to FIG. 2, orthogonal escape lines can be seen to extend from pin 36. Thus a vertical escape line 37 extends from pin 36 to the lower boundary 62 and upper boundary 66 of the core and an escape line 39 extends horizontally from pin 36 to obstacle 24 and boundary 68 and the set of escape lines dram from pins that are located either on the boundary of an obstacle or standing freely are termed the set of p-escape lines.

The escape graph G formed from the p-escape lines and the o-escape lines may also be considered as a set of vertices V and a set of line segments or edges E. The escape graph can thus be considered equivalent to a set of the intersection points of escape lines V (for example, 50, 52, 54, and 56 as shown in FIG. 2) and the segments of the escape lines E connecting any two of these intersection points (for example, 58 and 60 as shown in FIG. 2). This statement may be represented mathematically as G=(V,E).

The inventors have determined that for the type of MRSTO problem discussed above, an MRSTO tree is embedded within the escape graph developed by the above methodology. Although any suitable routing algorithm may be used to find a minimum Steiner tree in the escape graph developed above, two exemplary algorithms are disclosed herein as examples of suitable algorithms for finding an approximation of a minimum Steiner tree in the escape graph. The first algorithm is a maze-based algorithm, "algorithm M," and the second is a Steiner tree based algorithm that starts from a uniquely configured spanning tree, "algorithm S." Experimental results have shown that processor based performance of algorithm S runs faster than performance of algorithm M for nets having more than 7 pins (137 times faster for a net with 1694 pins) while the total path length is at most two percent (2%) longer than the path length produced by algorithm M (in some cases algorithm S even produced a shorter path length than algorithm M). As discussed above the present invention is deemed to include application of either of the M or S algorithms, as well as other algorithms that are known to be used, or may be used to find an approximation of a minimum Steiner tree in the escape graph.

Algorithm M

Figure 3A:
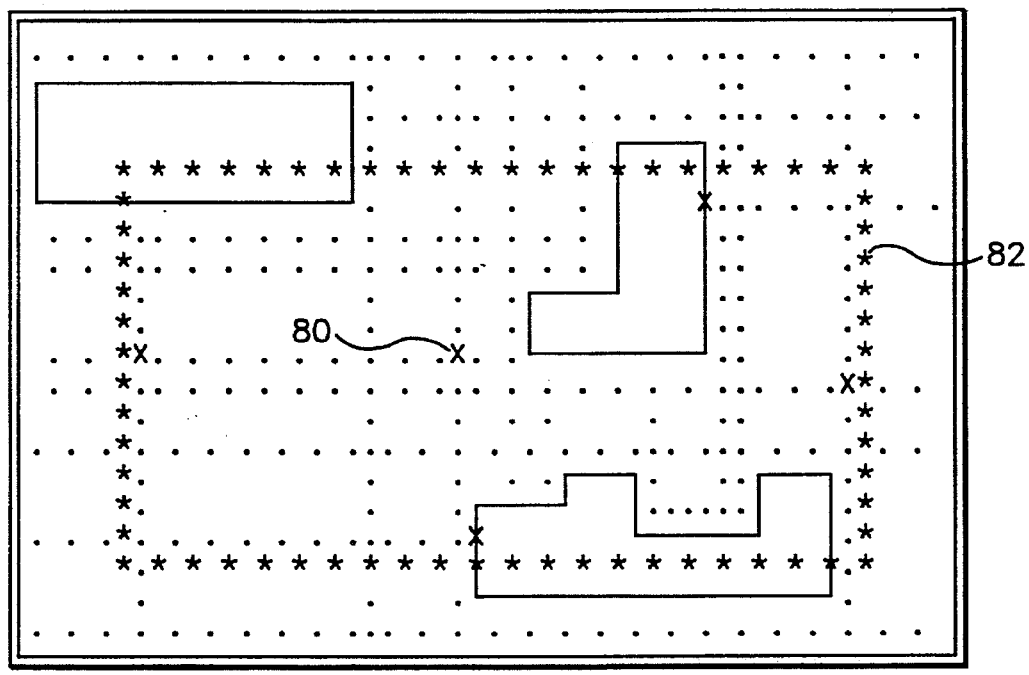
FIG. 3A is a bounding box contructed around the given pins for algorithm M.

Algorithm M is a maze router type algorithm that operates in a graph instead of a plane. The steps of Algorithm M are briefly described below and illustrated in FIG. 4. An input 130 to algorithm M includes the pins P and the escape graph found by the method discussed above and illustrated in FIGS. 6 and 7. In operation, a bounding box is first constructed around the set of pins P as illustrated at 132 in FIG. 4. An exemplary bounding box 82 is shown in FIG. 3A. The next step 134 involves selection of the pin that is the closest to the center of the bounding box surrounding all of the pins. This pin becomes the center point of a Steiner tree T that is being constructed. The center point 80 or first point on the Steiner tree T is shown in FIG. 3A.

A maze expansion step 138 is performed from the existing Steiner tree T (initially a single point 80), until another pin p that is not in T is reached. Any maze routing algorithm may be used to accomplish the maze expansion, such as for example, Lee's algorithm, Soukup's algorithm, and Hadlock's algorithm. These algorithms are meant as examples only and are not meant to limit the invention in any way. In Lee's algorithm, the central or source pin such as pin 80 in FIG. 3 is labeled as vertex 0. Each vertex in the escape graph connected by a single edge to vertex 0 is then labeled as some minimum weighting, such as 1. Vertices adjacent to these labeled 1 vertices are then labeled with a greater weighting value, such as 2. This labeling process continues until another pin in the boundary box has been reached. An example of this methodology is shown in FIG. 3B. Pins are connected starting at a pin with vertex having a value of N, and proceeding to another vertex with value of N−1 until the vertex of value 0 has been reached. One exemplary path is shown in FIG. 3B. Other paths could, of course, be found. Once two of the pins have been connected, such as the pin 51 at $X_0$ and pin 53 at $X_3$ in FIG. 3b, the values of the remaining vertices are reassigned. Each vertex along the Steiner tree path connecting $X_0$ and $X_3$ is reassigned the value of 0. Each vertex immediately adjacent the pins $X_0$ and $X_3$, as well as each vertex located adjacent to the Steiner tree path connecting $X_0$ and $X_3$ is now assigned a value of 1. Vertices further from the Steiner tree are similarly assigned new values. Once new values assigned to these vertices have been reassigned, another pin can be connected to the Steiner tree connecting the pins at $X_0$ and $X_3$. The additional path connecting this next pin with $X_0$ and $X_3$ is again determined by moving from a vertex having a value N, to a vertex having a value N−1, and then to a vertex having a value N−2, until the path is established. The procedure of recalculating the values to be assigned to each of the vertices is repeated, and a path to the next pin is determined, until all of the pins are connected.

A flow chart for processing means implementing the methodology of the present invention including the steps to be performed in algorithm M is illustrated in FIG. 6. After constructing the escape graph in the manner discussed above, the method illustrated in the flow chart of FIG. 6 further includes the steps of determining 140 a path from tree T to a pin p and including this path in the Steiner tree T searching 136 to find if any remaining pins that are not yet connected to the tree. When there are no pins remaining, the Steiner tree has been found as shown at decision step 142. If there are unconnected pins remaining, the maze expansion 138 process described above is repeated. This process continues until all pins have been connected with the Steiner tree T.

Since the size of the escape graph is usually much larger than the number of pins, the complexity of this algorithm is typically considered to be O $(n(n+k)^2)$. The resulting Steiner tree obtained by implementing algorithm M is usually close to optimal, since the algorithm restarts the maze expansion whenever it includes a pin in the Steiner tree.

Algorithm S

Figure 8:
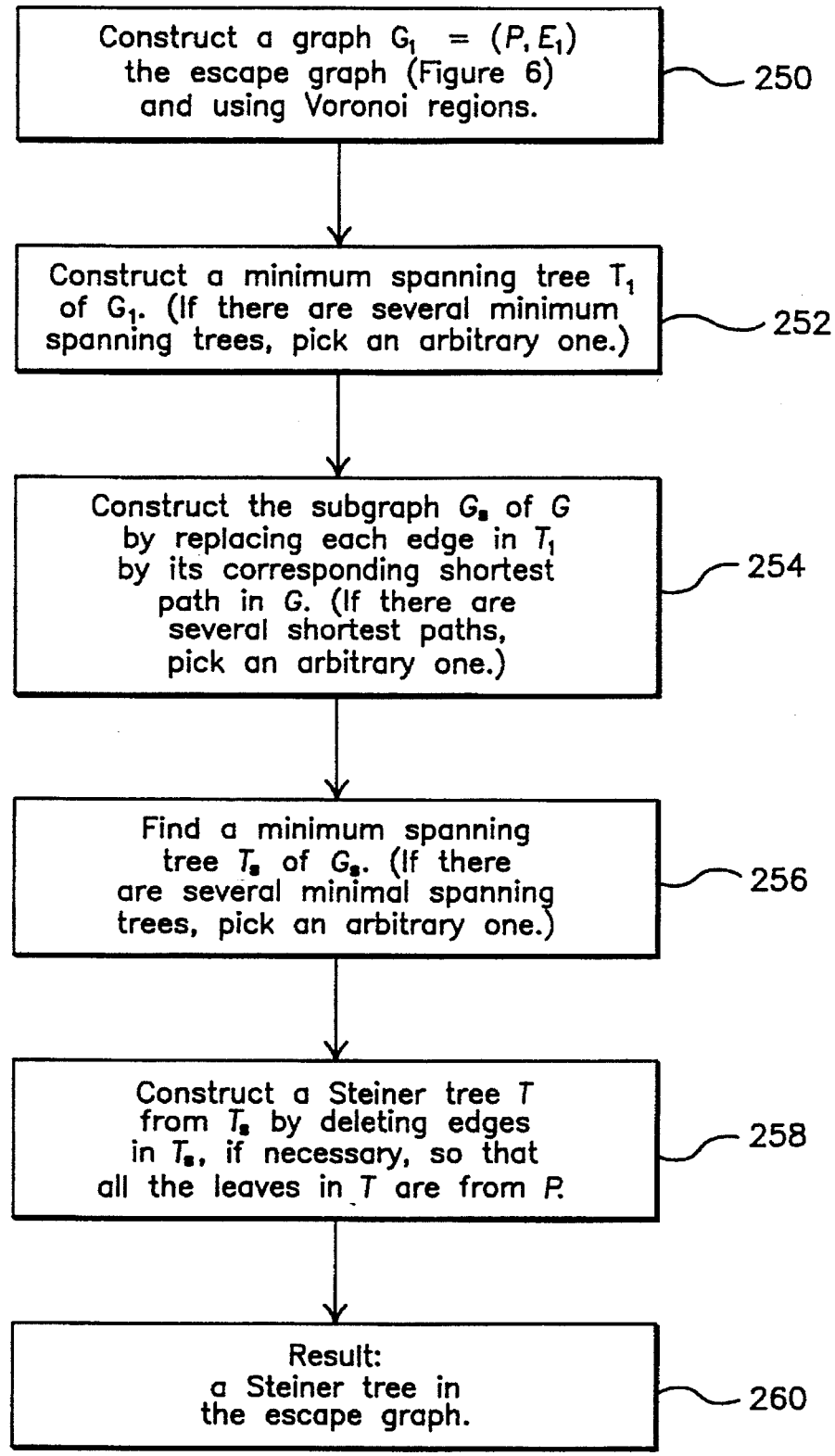
FIG. 8 is a flowchart of algorithm S.

Algorithm S is a Steiner tree based algorithm that employs the development of a spanning tree as a step in the formation of a minimum Steiner tree approximation. The steps of Algorithm S are briefly described below and a flow chart for implementing algorithm S is illustrated in FIG. 8.

As noted above, an escape graph is first determined from the predetermined locations of the pins and the obstacles in the core. The locations of electrical interconnection points on an integrated circuit die and the locations of functional components on the integrated circuit could, for example, provide the locations of the pins and obstacles in the core. Application of algorithm S to the escape graph discussed above also provides a methodology for determining an approximation of a minimum Steiner tree that interconnects all of the predetermined pins. Since the escape graph is constructed with the presence of obstacles, the approximation of a minimum Steiner tree developed on the escape graph provides a minimum rectilinear Steiner tree interconnecting the pins in the core even in the presence of the obstacles.

Figure 5:
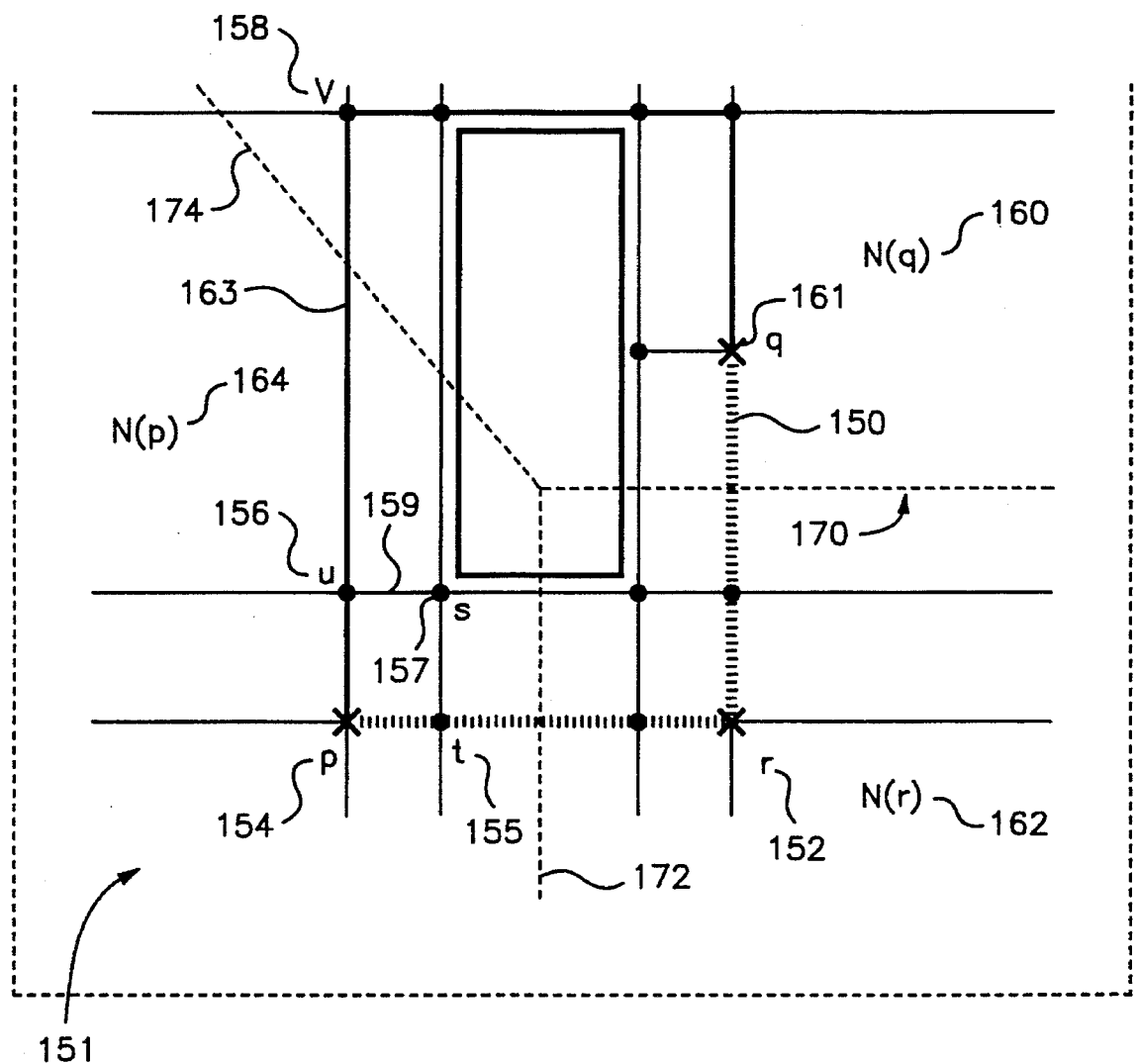
FIG. 5 is a graph divided into Voronoi regions used in algorithm S.

Application of algorithm S to the escape graph constructed in the manner discussed above initially requires subdividing the escape graph into regions about each pin. These regions are termed Voronoi regions. The Voronoi regions divide up the vertices of the escape graph so that all of the vertices closest to any particular pin are assigned to the Voronoi region associated with that pin. Referring to FIG. 5, there is shown an escape graph 151 divided into three exemplary Voronoi regions, including a Voronoi region N (q) at 160 that is associated with pin q at 161, Voronoi region N (r) at 162 associated with pin r at 152, and Voronoi region N (p) at 164 associated with pin p at 154. As shown in FIG. 5, each of vertex t at 155, vertex u at 156, and vertex s at 157 reside in Voronoi region N (p) at 164 since each of vertices s, t and v reside closer to pin p at 154 then any of the other pins in the escape graph, such as pin r at 152 and pin q at 161. If a vertex is at an equal distance to two separate pins, this vertex is arbitrarily assigned to one Voronoi region or another.

Application of algorithm S further requires formation of an additional graph termed graph $G_1$. This graph contains a set of vertices corresponding to all of the demand points or pins from the set P of the escape graph G that are to be interconnected. The graph $G_1$ also includes a set of edges $E_1$ that directly connect some, but not necessarily all, of the pins P of the graph $G_1$. The set of edges $E_1$ in the additional graph $G_1$ are constructed by reference to the escape graph G and the Voronoi regions constructed on the escape graph. Any two pins p and q in the graph $G_1$ are to be directly connected by an edge in $E_1$ if the corresponding pins p and q in the escape graph G have a path between them that includes an edge bridging the boundary between the two Voronoi regions in the escape graph G around the pins p and q in G.

That is, one of the vertices v and u forming the end points of the edge bridging the boundary between the Voronoi regions N(p) and N(q) must reside in one of these Voronoi regions and the other vertex must reside in the other Voronoi region. Referring again to FIG. 5, edge 159 having an end point u at vertex 156. and an end point s at vertex 157 would not be selected since both of the end points v and s of edge 159 reside at vertices 156 and 157 within a single Voronoi region N (p) at 164. Edge 163, however, includes an end point v at 158 located in Voronoi region N (q) at 160 and an end point u at vertex 156 located in Voronoi region N (p) at 164.

Once the set of edges $E_1$ has been constructed, there is associated with each of these edges in $E_1$ a number or weighting factor. This weighting factor may, but need not necessarily, be associated with a minimum path distance in G between the two pins in G corresponding to the two pins in $G_1$ that are directly connected. This minimum path must also include the edge in G bridging the modifies of the Voronoi regions of the pins in G. Mathematically this minimum path distance can be represented by the equation:

$$d'_1(p, q) = min \{d, (p, u) + d(u, v) + d_1(v, q)\}.$$

Where $d_1$ (p, u) is a minimum path from vertices p to u, and $d_1$ (v, q) is a minimum path from vertices v to q. The term d (u, v) is a weight or distance associated with the edge in the escape graph G having the end points u and v. Typically a shorter path may be found between any two pins, such as pins p and q, but this shorter path may not necessarily include the edge bridging the boundaries of the relevant Voronoi regions.

After the set of edges $E_1$ in the graph $G_1$ has been constructed and weights have been assigned to these edges, a minimum spannning $T_1$ is constructed from the graph $G_1$, based on the weights associated with the edges of the set $E_1$. Several minimum spanning trees may be found in $G_1$. In this instance any one of these minimum spanning trees may be arbitrarily selected.

Once the minimum spanning tree $T_1$ has been constructed, a new subgraph $G_s$ is constructed from the escape graph. This subgraph $G_s$ is constructed by selecting the shortest paths in G connecting the pins in P corresponding (for example, corresponding by weight) to the edges from the minimum spanning tree $T_1$ in the graph $G_1$. If there is more than one minimum path in G between any two connected pins that also satisfies this condition, then any one of these minimum paths in G may be arbitrarily selected. A minimum spanning tree $T_s$ is then cornered from the subgraph $G_s$. If more than one minimum spanning tree $T_s$ exists, then again one may be arbitrarily selected. After the minimum spanning tree $T_s$ has been constructed, a Steiner tree is constructed from this minimum spanning tree $T_s$. This Steiner tree is constructed by deleting from the minimum spanning tree $T_s$ end points of the tree $T_s$ (sometimes termed leaves) residing at vertices that are not demand pins. The edges connecting the deleted end points or leaves are also removed.

Using algorithm S for an MRSTO problem, a RSTO can be determined whose total length of all edges is at most 2(1−1/l) times that of a MRSTO, where l is the number of leaves in the MRSTO. The total complexity of this approach is O $((n+k)^2 log(n+k))$ times. Using algorithm S thus provides a faster method of finding a minimum Steiner tree in the escape graph than algorithm M when the number of pins n is sufficiently large.

In conclusion, it is to be understood that the present invention is not to be limited to that precisely as described hereinabove and as shown in the accompanying drawings. More specifically, any method of finding a Steiner tree in a graph may be used, as the algorithms specifically addressed are examples of these methods. Further, any weights, including but not limited to distance, for edges of the graph may be used for the purpose of eliminating or reducing the congestion on the chip during the routing of a set of nets. Accordingly, the present invention is not limited to the arrangements precisely as shown and described hereinabove.

What is claimed is:

1. In a process for fabricating an integrated circuit chip, a series of operational steps for constructing an approximate Minimum Rectilinear Steiner Tree (MRST) which constitutes an interconnective routing path for a net of pins on edges of rectilinear components of an integrated circuit such that said routing path extends between said components, said steps comprising:

(a) constructing an escape graph for said net in accordance with locations of said components, wherein said escape graph includes points which are formed by the intersection of lines from said pins and said edges of said components;

(b) constructing Voronoi regions in said escape graph;

(c) constructing a first graph including said pins, and edges connecting two of said pins respectively in said escape graph which extend between adjacent Voronoi regions;

(d) constructing a second graph as a minimum spanning tree of said first graph;

(e) constructing a third graph as a subgraph of said second graph including shortest paths in said escape graph corresponding to edges in said second graph;

(f) constructing a fourth graph as a minimum spanning tree of said third graph; and (g) constructing said approximate MRST from said fourth graph by deleting said points which constitute end points in said fourth graph and do not correspond to said pins.

2. A process as in claim 1, in which:

step (c) further comprises computing weights for said edges in accordance with lengths thereof in said escape graph; and step (d) further comprises constructing said second graph in accordance with said weights.

3. A process as in claim 1, in which step (a) comprises the substeps of:

(a1) constructing first rectilinear lines parallel to said edges of said components and second rectilinear lines passing through said pins; and (a2) constructing said escape graph as including said pins, and first and second rectilinear lines which interconnect said pins.

4. A process as in claim 3, in which step (a1) comprises constructing said first and second rectilinear lines as being spaced from said components by a predetermined distance.

5. A computer implemented method for constructing an approximate Minimum Rectilinear Steiner Tree (MRST) which constitutes an interconnective routing path for a net of pins on edges of rectilinear components of an integrated circuit such that said routing path extends between said components, comprising the steps of:

(a) constructing an escape graph for said net in accordance with locations of said components, wherein said escape graph includes points which are formed by the intersection of lines from said pins and said edges of said components;

(b) constructing Voronoi regions in said escape graph;

(c) constructing a first graph including said pins, and edges connecting two of said pins respectively in said escape graph which extend between adjacent Voronoi regions;

(d) constructing a second graph as a minimum spanning tree of said first graph;

(e) constructing a third graph as a subgraph of said second graph including shortest paths in said escape graph corresponding to edges in said second graph;

(f) constructing a fourth graph as a minimum spanning tree of said third graph; and (g) constructing said approximate MRST from said fourth graph by deleting said points which constitute end points in said fourth graph and do not correspond to said pins.

6. A method as in claim 5, in which:

step (c) further comprises computing weights for said edges in accordance with lengths thereof in said escape graph; and step (d) further comprises constructing said second graph in accordance with said weights.

7. A method as in claim 5, in which step (a) comprises the substeps of:

(a1) constructing first rectilinear lines parallel to said edges of said components and second rectilinear lines passing through said pins; and (a2) constructing said escape graph as including said pins, and first and second rectilinear lines which interconnect said pins.

8. A method as in claim 7, in which step (a1) comprises constructing said first and second rectilinear lines as being spaced from said components by a predetermined distance.

9. In a process for routing an integrated circuit chip, a series of operational steps for constructing an approximate Minimum Rectilinear Steiner Tree (MRST) which constitutes an interconnective routing path for a net of pins on edges of rectilinear components of an integrated circuit such that said routing path extends between said components, said steps comprising:

(a) constructing an escape graph for said net in accordance with locations of said components, wherein said escape graph includes points which are formed by the intersection of lines from said pins and said edges of said components;

(b) constructing Voronoi regions in said escape graph;

(c) constructing a first graph including said pins, and edges connecting two of said pins respectively in said escape graph which extend between adjacent Voronoi regions;

(d) constructing a second graph as a minimum spanning tree of said first graph;

(e) constructing a third graph as a subgraph of said second graph including shortest paths in said escape graph corresponding to edges in said second graph;

(f) constructing a fourth graph as a minimum spanning tree of said third graph; and (g) constructing said approximate MRST from said fourth graph by deleting said points which constitute end points in said fourth graph and do not correspond to said pins.

10. A process as in claim 9, in which:

step (c) further comprises computing weights for said edges in accordance with lengths thereof in said escape graph; and step (d) further comprises constructing said second graph in accordance with said weights.

11. A process as in claim 9, in which step (a) comprises the substeps of:

(a1) constructing first rectilinear lines parallel to said edges of said components and second rectilinear lines passing through said pins; and (a2) constructing said escape graph as including said pins, and first and second rectilinear lines which interconnect said pins.

12. A process as in claim 11, in which step (a1) comprises constructing said first and second rectilinear lines as being spaced from said components by a predetermined distance.

13. A system for fabricating an integrated circuit having a net of pins on edges of rectilinear components located thereon, comprising:

means for constructing an approximate Minimum Rectilinear Steiner Tree (MRST) which constitutes an interconnective routing path for said net of pins such that said routing path extends between said components, said constructing means comprising:

first processing means for constructing an escape graph for said net in accordance with locations of said components, wherein said escape graph includes points which are formed by the intersection of lines from said pins and said edges of said components; and second processing means for constructing said approximate MRST, the second processing means comprising:

third processing means for constructing Voronoi regions in said escape graph; and for constructing a first graph including said pins, and edges connecting two of said pins respectively in said escape graph which extend between adjacent Voronoi regions;

fourth processing means for constructing a second graph as a minimum spanning tree of said first graph;

fifth processing means for constructing a third graph as a subgraph of said second graph including shortest paths in said escape graph corresponding to edges in said second graph;

sixth processing means for constructing a fourth graph as a minimum spanning tree of said third graph; and seventh processing means for constructing said approximate MRST from said fourth graph by deleting said points which constitute end points in said fourth graph and do not correspond to said pins.

14. A system as in claim 13, in which:

the third processing means further computes weights for said edges in accordance with lengths thereof in said escape graph; and the fourth processing means further constructs said second graph in accordance with said weights.

15. A system as in claim 13, in which the first processing means comprises:

eighth processing means for constructing first rectilinear lines parallel to said edges of said components and second rectilinear lines passing through said pins; and ninth processing means for constructing said escape graph as including said pins, and first and second rectilinear lines which interconnect said pins.

16. A system as in claim 15, in which the eighth processing means constructs said first and second rectilinear lines as being spaced from said components by a predetermined distance.

17. A system for routing an integrated circuit having a net of pins on edges of rectilinear components located thereon, comprising:

means for constructing an approximate Minimum Rectilinear Steiner Tree (MRST) which constitutes an interconnective routing path for said net of pins such that said routing path extends between said components, said constructing means comprising:

first processing means for constructing an escape graph for said net in accordance with locations of said components, wherein said escape graph includes points which are formed by the intersection of lines from said pins and said edges of said components; and second processing means for constructing said approximate MRST, the second processing means comprising:

third processing means for constructing Voronoi regions in said escape graph; and for constructing a first graph including said pins, and edges connecting two of said pins respectively in said escape graph which extend between adjacent Voronoi regions;

fourth processing means for constructing a second graph as a minimum spanning tree of said first graph;

fifth processing means for constructing a third graph as a subgraph of said second graph including shortest paths in said escape graph corresponding to edges in said second graph;

sixth processing means for constructing a fourth graph as a minimum spanning tree of said third graph; and seventh processing means for constructing said approximate MRST from said fourth graph by deleting said points which constitute end points in said fourth graph and do not correspond to said pins.

18. A system as in claim 17, in which:

the third processing means further computes weights for said edges in accordance with lengths thereof in said escape graph; and the fourth processing means further constructs said second graph in accordance with said weights.

19. A system as in claim 17, in which the first processing means comprises:

eighth processing means for constructing first rectilinear lines parallel to said edges of said components and second rectilinear lines passing through said pins; and ninth processing means for constructing said escape graph as including said pins, and first and second rectilinear lines which interconnect said pins.

20. A system as in claim 19, in which the eighth processing means constructs said first and second rectilinear lines as being spaced from said components by a predetermined distance.

* * * * *